United States Patent
Hsu et al.

(10) Patent No.: US 7,012,019 B2
(45) Date of Patent: Mar. 14, 2006

(54) CIRCUIT BARRIER STRUCTURE OF SEMICONDUCTOR PACKAGING SUBSTRATE AND METHOD FOR FABRICATING THE SAME

(75) Inventors: Shih-Ping Hsu, Hsin-chu (TW); Kun-Chen Tsai, Hsin-chu (TW)

(73) Assignee: Phoenix Precision Technology Corporation, (TW)

( * ) Notice: Subject to any disclaimer, the term of this patent is extended or adjusted under 35 U.S.C. 154(b) by 0 days.

(21) Appl. No.: 10/876,475

(22) Filed: Jun. 28, 2004

(65) Prior Publication Data

US 2005/0082672 A1     Apr. 21, 2005

(30) Foreign Application Priority Data

Oct. 17, 2003    (TW) ............................. 92128801 A (51) Int. Cl.
*H01L 21/4763* (2006.01)
*H01L 21/44* (2006.01)
*H01L 23/52* (2006.01)
*H01L 29/40* (2006.01)

(52) U.S. Cl. ...................... 438/618; 438/627; 438/652; 438/653; 257/748; 257/774

(58) Field of Classification Search ................ 438/618, 438/627, 652, 653; 257/748, 774
See application file for complete search history.

(56) References Cited

U.S. PATENT DOCUMENTS

| | | | | |
|---|---|---|---|---|
| 5,275,715 A | * | 1/1994 | Tuttle | 205/123 |
| 5,436,198 A | * | 7/1995 | Shibata | 438/613 |
| 5,633,189 A | * | 5/1997 | Yen et al. | 438/600 |
| 5,645,628 A | * | 7/1997 | Endo et al. | 106/1.23 |

FOREIGN PATENT DOCUMENTS

EP        628998 A1 *  5/1994

* cited by examiner

*Primary Examiner*—Steve Loke
*Assistant Examiner*—Samuel A. Gebremariam
(74) *Attorney, Agent, or Firm*—Clark & Brody; William F. Nixon (57) ABSTRACT

A circuit barrier structure of a semiconductor packaging substrate and a method for fabricating the same, forming a metal conductive layer on an insulating layer of the substrate and a patterned resist layer on the metal conductive layer. The patterned resist layer has a plurality of holes to expose predetermined parts of the metal conductive layer. A metal barrier layer is formed on the resist layer and in the holes. A patterned circuit layer is electroplated in the holes of the resist layer after removing the metal barrier layer on the resist layer. The resist layer and the metal conductive layer underneath the resist layer are removed. Another metal barrier layer can be formed on the circuit layer. The patterned circuit layer is covered by the metal barrier layers to prevent damage from etching to the circuit layer and inhibit migration of metal particles in the circuit layer.

5 Claims, 6 Drawing Sheets

CIRCUIT BARRIER STRUCTURE OF SEMICONDUCTOR PACKAGING SUBSTRATE AND METHOD FOR FABRICATING THE SAME

FIELD OF THE INVENTION

The present invention relates to circuit barrier layers of semiconductor packaging substrates and fabrication methods thereof, and more particularly, to a metal barrier layer formed on a circuit layer of a substrate used in a semiconductor package, and a method for fabricating the same.

BACKGROUND OF THE INVENTION

Electronic products have been developed to have low profile, multiple functions and high and rapid performance, making printed circuit board (PCB) or integrated circuit (IC) packaging substrate formed with fine circuits and small pitches. Current PCB or IC packaging substrate has dimensions including line width, trace pitch and aspect ratio reduced from greater than 100 μm to about 30 μm, and further dimensional decrease is endeavored. Therefore, how to fabricate a circuit board with fine circuits arranged in high density and fine vias, which can reduce the number of laminated layers in a substrate but not significantly increase the fabrication cost, is an important topic sought to be achieved in the IC and other related electronic industries. The circuit build-up technology plays a key role in determining the density of circuits during fabrication of the circuit board, such that a pattern plating method or SAP (semi-addition process) technique is commonly employed to form fine build-up circuits for the circuit board.

Figure 1A:
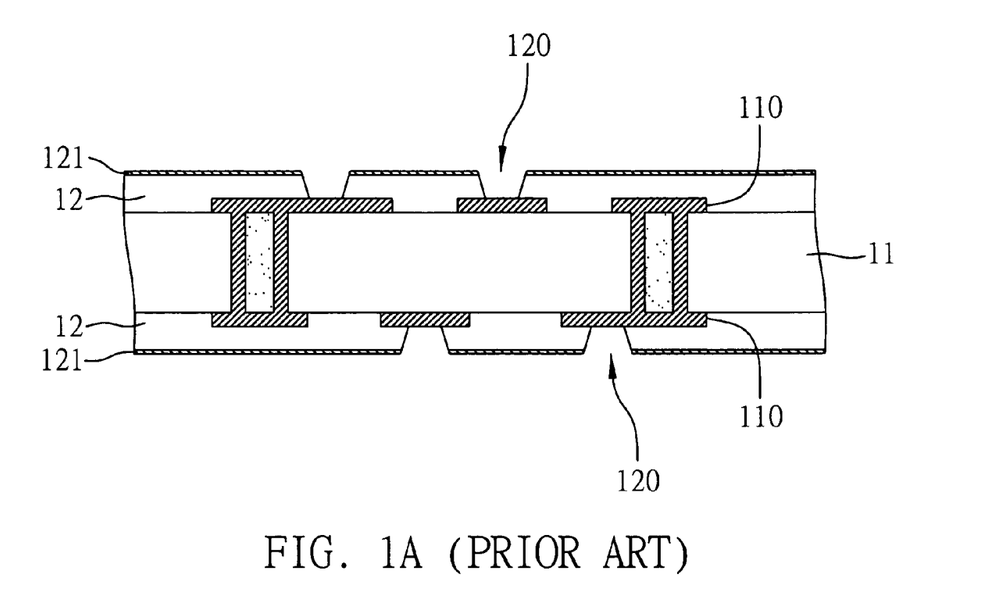
FIGS. 1A–1D (PRIOR ART) are cross-sectional schematic diagrams showing procedural steps for a conventional pattern plating method.

FIGS. 1A to 1D show procedural steps for the conventional pattern plating method. Referring to FIG. 1A, a core circuit board 11 is prepared. An insulating layer 12 with a metal conductive layer 121, such as resin coated with copper (RCC), is formed respectively on upper and lower surfaces of the core circuit board 11, and a plurality of holes 120 are formed in the insulating layer 12 by laser drilling to expose predetermined parts of the inner circuits 110.

Figure 1B:
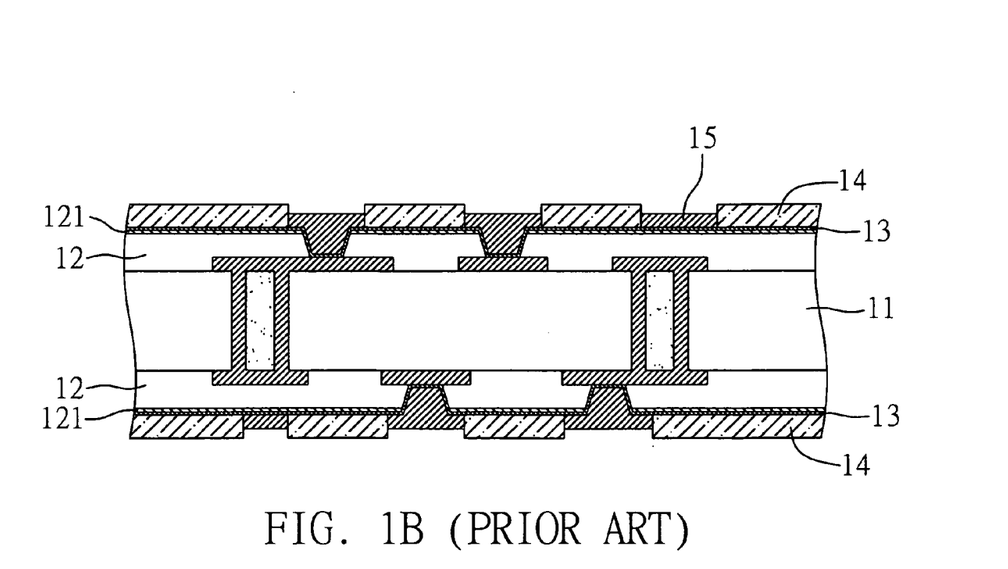

Referring to FIG. 1B, a conductive seed layer 13 (such as electroless-plated copper layer) is formed on the metal conductive layer 121 and the exposed parts of the inner circuits 110. A resist layer 14 is applied over the seed layer 13 and formed with a plurality of holes for exposing predetermined parts of the seed layer 13. Then a patterned circuit layer 15 is deposited by electroplating on the exposed parts of the seed layer 13. Alternatively for the SAP technique, a conductive seed layer is directly formed on the insulating layer on each of the surfaces of the core circuit board, and other fabrication processes are similar to the pattern plating method, thereby not further to be repeated here.

Figure 1C:
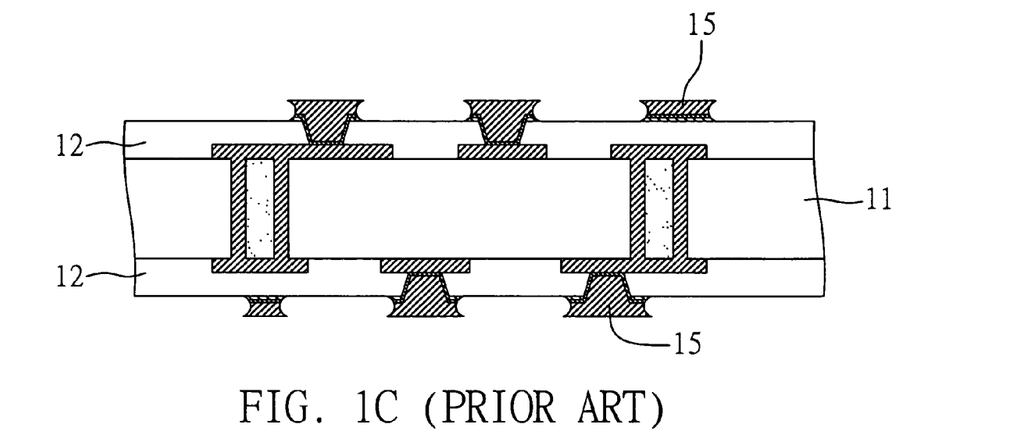

Referring to FIG. 1C, the resist layer 14 is removed. The seed layer 13 and the metal conductive layer 121, which are originally covered by the resist layer 14, are etched away. Then the above fabrication processes are repeated to form more insulating layers and build-up circuit layers so as to form a multi-layer circuit board.

The circuit layer 15 on the surface of the circuit board partly extends to form electrical connection pads for transmission of electrical signals or power. Metal layer such as Ni (nickel)/Au (gold) is usually formed on an exposed surface of each of the electrical connection pads to facilitate bonding between the electrical connection pads and conductive elements such as gold wires, solder bumps, pre-solder bumps or solder balls that are electrically coupled to a chip or circuit board. Further, the metal layer helps prevent the electrical connection pads from oxidation if they are exposed.

Figure 1D:
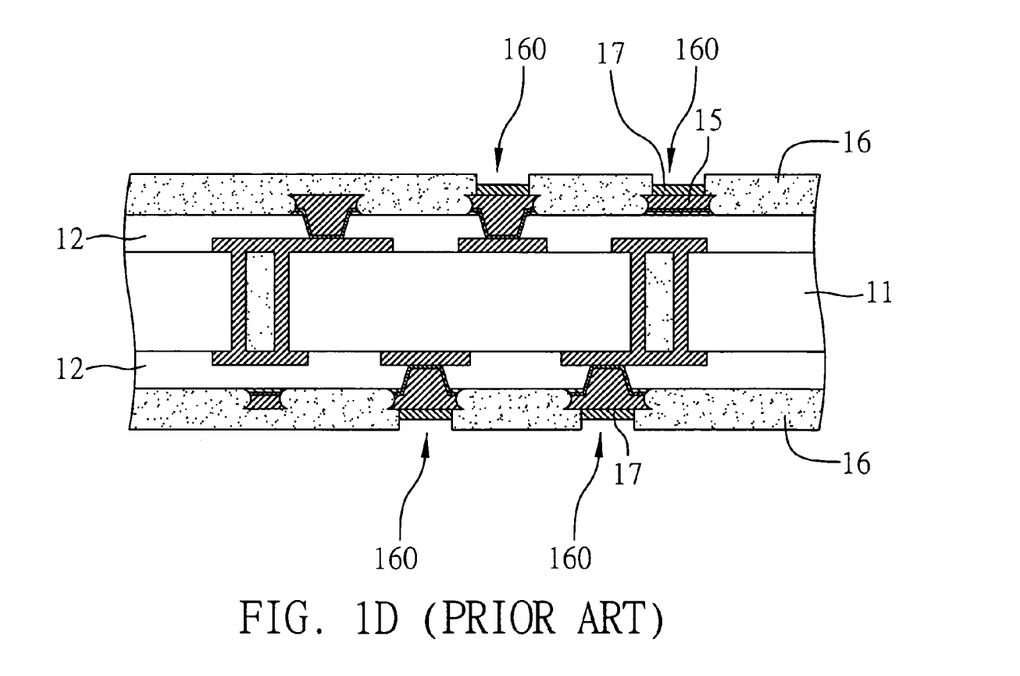

The seed layer 13 and the metal conductive layer 121 for the electrical conduction purpose are etched away and removed after the patterned circuit layer 15 is electroplated. For protecting the circuit layer 15 on the surface of the circuit board against external contamination, a solder mask 16 such as green paint is applied on the circuit layer 15 by printing or coating, and is patterned to form a plurality of openings 160 to expose the electrical connection pads of the circuit layer 15. Subsequently, an electroless plating process such as electroless nickel/immersion gold (EN/IG) is performed to deposit a Ni/Au metal layer 17 on each of the electrical connection pads exposed via the openings 160, as shown in FIG. 1D.

On the other hand, an electroplating process may also be employed to form the Ni/Au metal layer on the electrical connection pads of the circuit layer 15. However, the seed layer 13 and the metal conductive layer 121, serving as electrical conductive paths, are made of copper that is the same material forming the circuit layer 15. After completing the electroplating process, the etching process for removing the seed layer 13 and the metal conductive layer 121 underneath the resist layer 14 would also cause the circuit layer 15 to be etched and damaged, leading to deformation or shrinkage of the circuit layer 15. Compared to the SAP technique, this problem is more severe in the pattern plating method, because the extra metal conductive layer 121 on the insulating layer 12 requires much time in process for etching away, thereby making the circuit layer 15 more seriously damaged and deformed e.g. shrinkage. The damage and shrinkage would adversely affect the electrical performance of the circuit board especially formed with fine and densely arranged circuits.

Moreover, for miniaturizing the size and increasing the functions of electronic products, the circuits are becoming more densely arranged in the circuit board, and thus the laminated layers of the circuit board are becoming thinner. In such a case, copper particles forming the circuits may migrate and diffuse to the insulating layer, causing the copper migration effect in the insulating layer between adjacent circuits or adjacent circuit layers. Also in the densely packed circuit board, the insulating layer is sized relatively thinner. As a result, if the thinner insulating layer contains conductive copper particles, the insulation effect would be degraded and easily result in short circuit between adjacent circuits or adjacent circuit layers, making the circuit board fail. Further, with the usage time of the circuit board increased, the copper migration effect becomes more serious that more and more copper particles would move to the insulating layer, making the insulating layer become conductive and lose its insulation property.

Therefore, the problem to be solved herein is to provide a substrate or circuit board with densely arranged circuits and build-up layers, which can avoid the copper migration effect and prevent the circuits from being damaged or deformed (e.g. shrinkage) by etching.

SUMMARY OF THE INVENTION

In light of the foregoing prior-art drawbacks, a primary objective of the present invention is to provide a circuit barrier structure of a semiconductor packaging substrate and a method for fabricating the same, which can prevent circuit layers from be damaged or deformed (e.g. shrinkage) by etching during removal of seed layer and metal conductive layer.

Another objective of the present invention is to provide a circuit barrier structure of a semiconductor packaging substrate and a method for fabricating the same, which can inhibit migration of metal particles in the circuit layers.

A further objective of the present invention is to provide a circuit barrier structure of a semiconductor packaging substrate and a method for fabricating the same, which can allow circuits to be densely arranged and build-up layers to be thinner to form a multi-layer substrate.

In accordance with the above and other objectives, the present invention proposes a method for fabricating a circuit barrier structure of a semiconductor packaging substrate, comprising the steps of: preparing the substrate having inner circuits and an insulating layer, forming a metal conductive layer on a surface of the substrate, and forming a patterned resist layer on the metal conductive layer, wherein the patterned resist layer has a plurality of holes to expose predetermined parts of the metal conductive layer; forming a metal barrier layer on the patterned resist layer and in the holes of the first resist layer to cover the exposed parts of the metal conductive layer, and removing the metal barrier layer on the patterned resist layer; performing an electroplating process to form a patterned circuit layer in the holes of the resist layer and on the metal barrier layer; and removing the resist layer and the metal conductive layer covered by the resist layer. The patterned circuit layer is covered by the metal barrier layer in the holes of the resist layer, so as to inhibit migration of metal particles in the circuit layer. Further, during removal of part of the metal conductive layer by etching process, the covered circuit layer can be prevented from being damaged or deformed (e.g. shrinkage).

In another embodiment, after forming the patterned circuit layer, the electroplating process is continued to form another metal barrier layer on the patterned circuit layer, such that the patterned circuit layer is completely covered by the metal barrier layers to effectively inhibit migration of metal particles in the circuit layer.

Moreover, after fabricating the circuit layer and/or the metal barrier layer lying on the circuit layer, since the circuit layer may contain a plurality of electrical connection pads for the external electrical connection purpose, a solder mask layer can be applied on the substrate when the patterned resist layer and the metal conductive layer underneath the resist layer are removed. The solder mask layer is formed with a plurality of openings to expose the electrical connection pads. Then, an electroless plating process is performed to form a metal protection layer such as Nickel/Gold (Ni/Au) respectively on the exposed electrical connection pads, so as to allow the electrical connection pads to effectively provide the electrical coupling between a chip or circuit board and conductive elements such as gold wires, solder bumps, pre-solder bumps or solder balls, and also to prevent the electrical connection pads from oxidation if they are exposed.

In another embodiment, after fabricating the circuit layer and/or the metal barrier layer lying thereon, the patterned resist layer for fabricating the circuit layer, and the metal conductive layer that serves as a current conductive path, are maintained for next process to form the metal protection layer on the electrical conductive pads. A second resist layer is formed on the surface of the substrate to cover the circuit layer, with the electrical connection pads of the circuit layer exposed from the second resist layer. An electroplating process is performed to form the metal protection layer such as Ni/Au respectively on the electrical connection pads. Then a solder mask layer such as green paint is applied on the substrate and patterned to have a plurality of openings to expose the metal protection layer on the electrical connection pads.

By the above fabrication processes, the circuit barrier structure formed on a semiconductor packaging substrate according to the present invention comprises a metal conductive layer formed on an insulating layer of the substrate; a patterned circuit layer electroplated on the metal conductive layer; and a metal barrier layer formed on sides and the bottom of the patterned circuit layer. Another metal barrier layer can be formed on the top of the patterned circuit layer. A solder mask layer can be formed on the substrate, the solder mask layer being patterned to have a plurality of openings to expose electrical connection pads of the circuit layer. And a metal protection layer (such as Ni/Au layer) can be formed in the openings of the solder mask layer and on the exposed electrical connection pads respectively. Alternatively, the metal protection layer can be directly formed by electroplating on the electrical connection pads to provide good electrical connection and protection functions.

For fabricating the patterned circuit layer, the metal barrier layer is formed in holes of a resist layer on the metal conductive layer, and then the patterned circuit layer is formed in the holes using the metal conductive layer as a current conductive path, such that the bottom and sides of the patterned circuit layer are covered by the metal barrier layer thereby inhibiting migration of metal particles in the circuit layer. Further, during the process of removing part of the metal conductive layer by etching, since the bottom and sides of the circuit layer are covered by the metal barrier layer, the circuit layer would not be damaged or deformed (e.g. shrinkage) by etching and can be maintained intact. Another metal barrier layer can be further formed on the top of the patterned circuit layer, such that the circuit layer is completely covered by the metal barrier layers, which can eliminate the cross-talk problem (such as coupling signals, etc.) and high frequency effect between adjacent circuits, and also inhibit migration of copper particles to the insulating layer between adjacent circuits or between adjacent circuit layers. As a result, the insulating layer of the substrate can be made thinner to form a thinner multi-layer circuit board.

Moreover, a solder mask layer can be formed on the substrate and be patterned to have a plurality of openings, allowing the electrical connection pads of the patterned circuit layer to be exposed via the openings. A metal protection layer (such as Ni/Au layer) can be formed in the openings of the solder mask layer and on the electrical connection pads. Alternatively, during fabricating the patterned circuit layer and the metal barrier layer, a second resist layer can be formed, using the metal conductive layer as the current conductive path, to cover the circuit layer except the electrical connection pads, and then the electroplating process is performed to form the metal protection layer on the electrical connection pads.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a circuit barrier structure of a semiconductor packaging substrate and a method for fabricating the same proposed in the present invention are described with reference to FIGS. 2A–2F and 3A–3C.

FIGS. 2A to 2F show a series of procedural steps of the method for fabricating a circuit barrier structure of a semiconductor packaging substrate according to a preferred embodiment of the present invention.

Figure 2A:
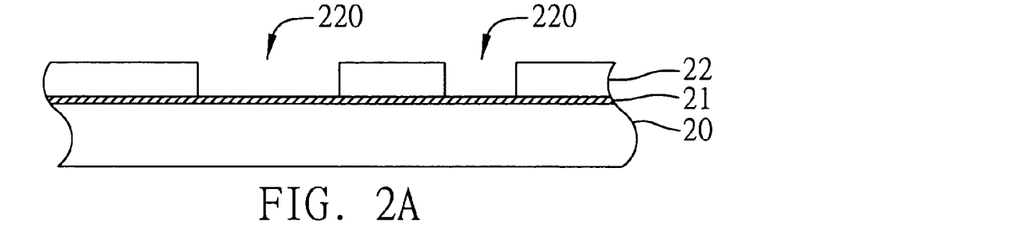
FIGS. 2A–2F are cross-sectional schematic diagrams showing a series of procedural steps of a method for fabricating a circuit barrier structure of a semiconductor packaging substrate according to a preferred embodiment of the present invention.

Referring to FIG. 2A, the substrate having inner circuits (not shown) and an insulating layer 20 is prepared. A metal conductive layer 21 is formed on a surface of the substrate having the insulating layer 20. A resist layer 22 is formed on the metal conductive layer 21 and is patterned to have a plurality of holes 220 to expose predetermined parts of the metal conductive layer 21. The insulating layer 20 can be any one of dielectric layers in a packaging substrate with multiple circuit layers.

The insulating layer 20 with the metal conductive layer 21 can be fabricated by depositing a metal conductive layer such as copper layer on an insulating layer made of glass fiber, phenolic polyester or epoxy resin, or by using resin coated with copper (RCC), or a metal conductive layer such as copper layer can be directly pressed on the insulating layer, so as to enhance bondability and growth of copper in a subsequent electroplating process. Moreover, the insulating layer can be formed with openings to expose inner circuits of the substrate, allowing a conductive seed layer to be deposited by electroless plating on the insulating layer and the exposed inner circuits, such that conductive vias can be subsequently formed by electroplating in the openings of the insulating layer to electrically interconnect circuit layers (not shown) of the substrate.

The resist layer 22 is applied on the metal conductive layer 21 by printing, coating, spin-coating or adhering. The resist layer 22 can be made of a dry-film photoresist or liquid photoresist. The resist layer 22 is patterned by exposing and developing to form the plurality of holes 220 for exposing the predetermined parts of the metal conductive layer 21.

Figure 2B:
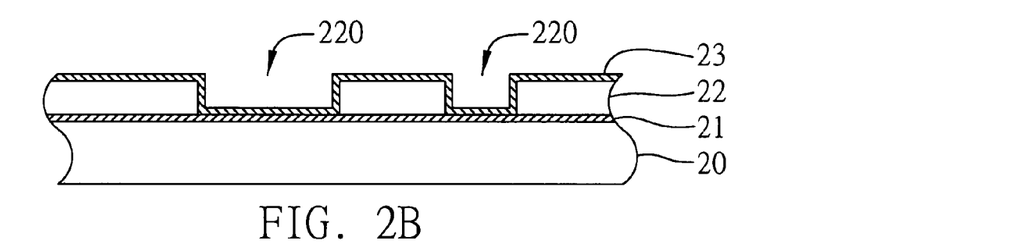

Referring to FIG. 2B, a metal barrier layer 23 is deposited on the patterned resist layer 22, the exposed parts of the metal conductive layer 21 and side walls of the holes 220. The metal barrier layer 23 can be made of a metal such as Chromium (Cr), Nickel (Ni), Cobalt (Co), Palladium (Pd), Tantalum (Ta) or Titanium (Ti), or an alloy thereof. The metal barrier layer 23 can be formed by physical vapor deposition, chemical vapor deposition, electroless plating or chemical deposition, such as sputtering, evaporation, arc vapor deposition, ion beam sputtering, laser ablation deposition or plasma enhanced chemical vapor deposition.

Figure 2C:
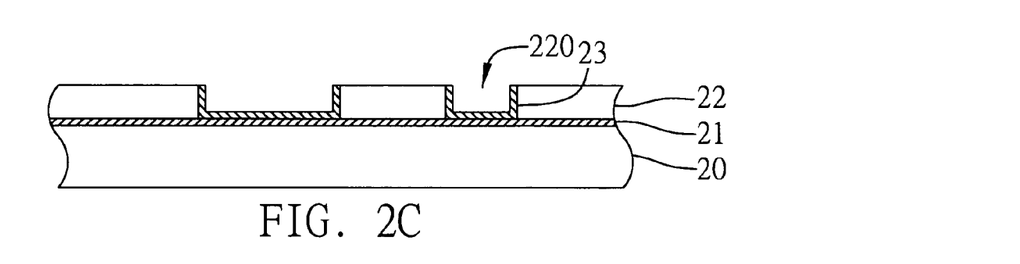

Referring to FIG. 2C, the metal barrier layer 23 located on the patterned resist layer 22 is removed by for example grinding, while the metal barrier layer 23 on the exposed parts of the metal conductive layer 21 and the side walls of the holes 220 is retained.

Figure 2D:
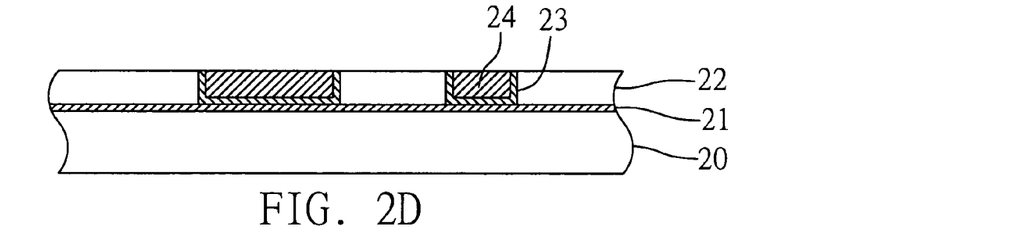

Referring to FIG. 2D, an electroplating process is performed, using the metal conductive layer 21 as a current conductive path, to form a patterned circuit layer 24 in the holes 220 of the resist layer 22. It could be understand that the bottom and sides of the circuit layer 24 are covered by the retained metal barrier layer 23. The circuit layer 24 is primarily made of copper. As indicated in the Appendix of Modern Electroplating published in 2000 by John, Wiley & Sons, Inc., the coefficient of resistance of a material for the metal barrier layer in the room temperature includes: Ni (13 $\mu\Omega$-cm), Cr (6.84 $\mu\Omega$-cm), Co (6.24 $\mu\Omega$-cm), Pd (10.8 $\mu\Omega$-cm), Ta (11.5 $\mu\Omega$-cm), and Ti (80 $\mu\Omega$-cm), and these metals are thus good electrical conductors; and the coefficient of resistance of copper is 1.673 $\mu\Omega$-cm.

Further, referring to FIG. 2D', after fabricating the patterned circuit layer 24, the electroplating process can be continued to form another metal barrier layer 23 on the top of the patterned circuit layer 24, such that the circuit layer 24 is completely covered by the metal barrier layers 23, 23, thereby effectively reducing the occurrence of migration of metal particles in the circuit layer 24.

Figure 2E:
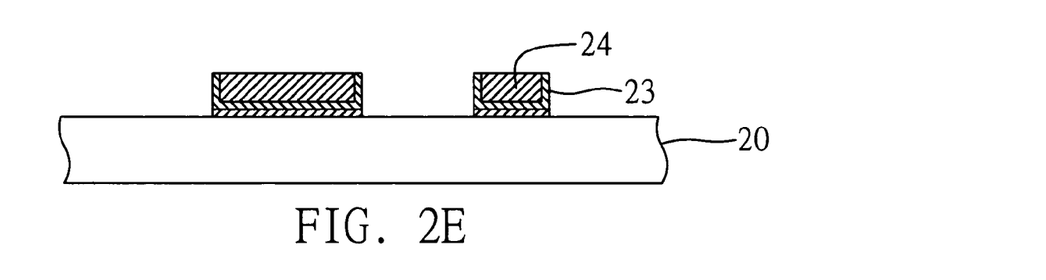

Referring to FIGS. 2E and 2E', the resist layer 22 and the metal conductive layer 21 underneath the resist layer 22 are removed. When the part of the metal conductive layer 21 is removed by for example etching, since the circuit layer 24 is covered by the metal barrier layers 23, the etchant for removing metal conductive layer 21 (normally made of copper) would not damage or deform the circuit layer 24 e.g. shrinkage of the circuit layer 24.

Figure 2F:
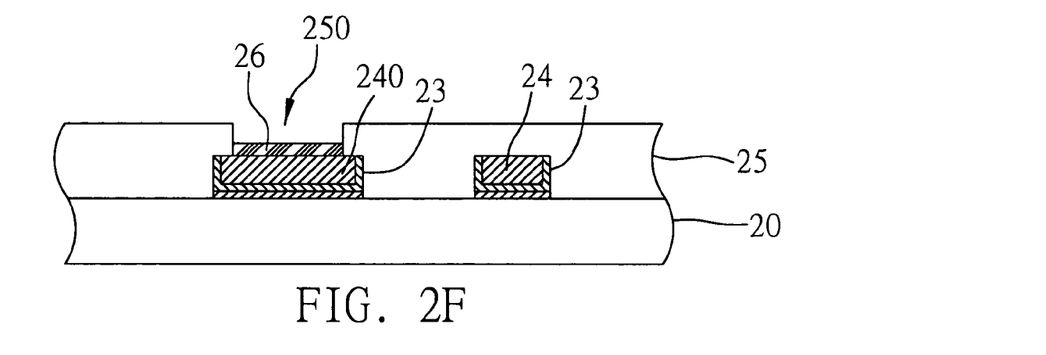

Moreover, referring to FIGS. 2F and 2F', after fabricating the circuit layer 24 and/or the metal barrier layer 23 lying thereon, since the circuit layer 24 contains a plurality of electrical connection pads 240 for the external electrical connection purpose, a solder mask layer 25 can be applied on the substrate when the patterned resist layer and the metal conductive layer underneath the resist layer are removed. The solder mask layer 25 is patterned to have a plurality of openings 250 to expose the electrical connection pads 240. Then, an electroless plating process is performed, such as electroless Nickel/immersion Gold (EN/IG), to form a metal protection layer 26 such as Nickel/Gold (Ni/Au) respectively on the exposed electrical connection pads 240, so as to allow the electrical connection pads 240 to effectively provide the electrical coupling between a chip or circuit board (not shown) and conductive elements such as gold wires, solder bumps, pre-solder bumps or solder balls, and also to prevent the electrical connection pads 240 from oxidation if they are exposed.

Figure 3A:
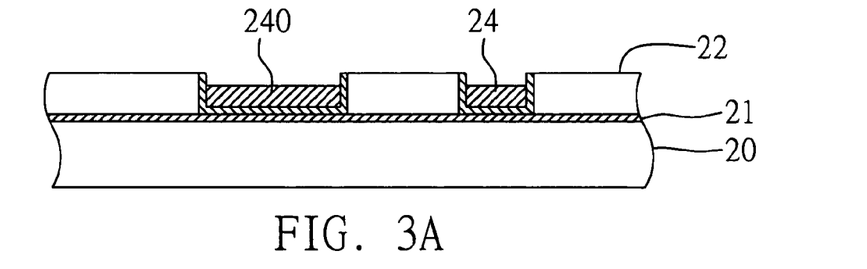
FIGS. 3A–3C is a cross-sectional schematic diagrams showing a series of procedural steps of a method for fabricating a circuit barrier structure of a semiconductor packaging substrate according to another preferred embodiment of the present invention.
Figure 3B:
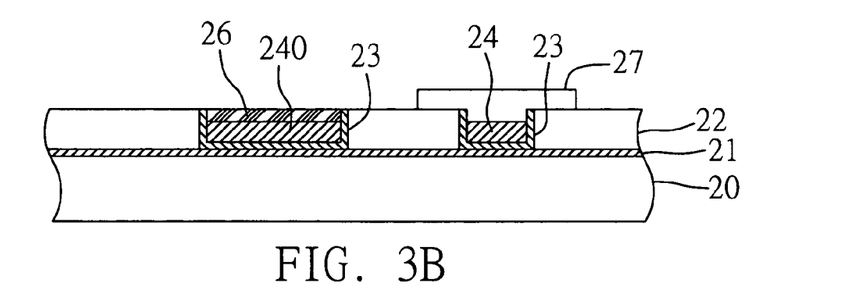
Figure 3C:
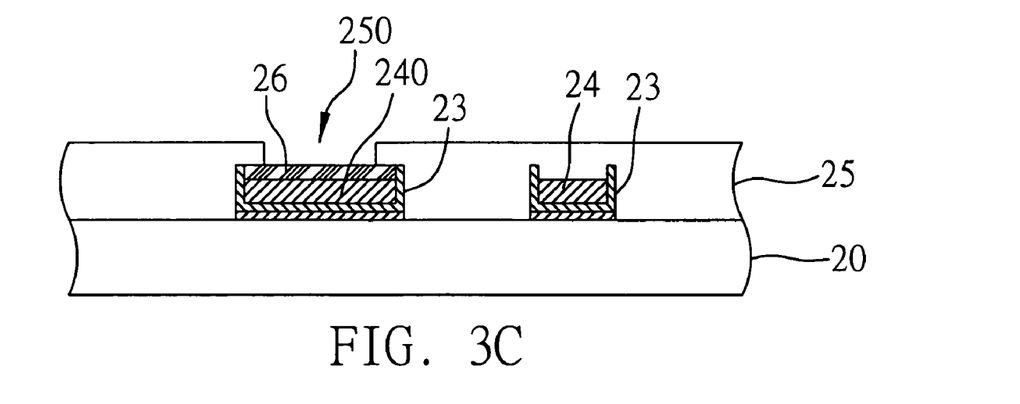

FIGS. 3A to 3C show a series of procedural steps of a method for fabricating a circuit barrier structure of a semiconductor packaging substrate according to another preferred embodiment of the present invention.

Referring to FIG. 3A, the above fabrication processes are repeated to form the circuit layer 24 on the insulating layer 20, or as shown in FIG. 3A', the electroplating process is further repeated to form the metal barrier layer 23 on the circuit layer 24. After that, the patterned resist layer 22 (hereinafter referred to as "first resist layer 22") for fabricating the circuit layer 24, and the metal conductive layer 21 that serves as the current conductive path, are retained to serve as the subsequent current conductive path for forming a metal protection layer (not shown) respectively on the electrical connection pads 240.

Referring to FIGS. 3B and 3B', a second resist layer 27 is formed on the surface of the substrate to cover the circuit layer 24 with the electrical connection pads 240 exposed from the second resist layer 27. An electroplating process is performed to form the metal protection layer 26 respectively on the electrical connection pads 240 through the current conductive path including the metal conductive layer 21 and the electrical connection pads 240, so as to increase the contact area between the electrical connection pads 240 and the metal protection layer 26 and facilitate electrical coupling between the electrical connection pads 240 and conductive elements (such as metal bumps, solder balls, pre-solder bumps or bonding wires), as well as prevent the electrical connection pads 240 from oxidation if they are exposed.

The second resist layer 27 formed on the surface of the substrate can be made of a dry-film photoresist or liquid photoresist and patterned by exposing and developing to form a plurality of holes to expose the electrical connection pads 240.

The metal protection layer 26 can be made of Gold (Au), Ni, Pd, Silver (Ag), Tin (Sn), Ni/Pd, Cr/Ti, Ni/Au, Pd/Au or Ni/Pd/Au. Preferably, the metal protection layer 26 is an electroplated Ni/Au layer, for which a Ni layer is first formed by electroplating, and then an Au layer is plated on the Ni layer. Alternatively, the metal protection layer 26 can be an Au layer directly plated on the electrical connection pads 240.

Referring to FIGS. 3C and 3C', the second resist layer 27, the first resist layer 22 and the metal conductive layer 21 covered by the first resist layer 22 are removed. A solder mask layer 26 such as green paint is applied on the substrate and formed with a plurality of openings 250 to expose the metal protection layer 26 on the electrical connection pads 240.

The above fabricated circuit barrier structure comprises a metal conductive layer 21 formed on a surface of the substrate having inner circuits and an insulating layer, at least one patterned circuit layer 24 formed by electroplating on the metal conductive layer 21, and a metal barrier layer 23 formed on the bottom and sides of the patterned circuit layer 24. For fabricating the patterned circuit layer 24, the metal barrier layer 23 is deposited in holes 220 of a resist layer 22 on the metal conductive layer 21, and then the patterned circuit layer 24 is formed in the holes 220 using the metal conductive layer 21 as a current conductive path, such that the bottom and sides of the patterned circuit layer 24 are covered by the metal barrier layer 23 thereby inhibiting migration of metal particles in the circuit layer 24. Further, during the process of removing part of the metal conductive layer 21 by etching, since the bottom and sides of the circuit layer 24 are covered by the metal barrier layer 23, the circuit layer 24 would not be damaged or deformed (e.g. shrinkage) by etching and can be maintained intact.

Another metal barrier layer 23 can be further formed on the top of the patterned circuit layer 24, such that the circuit layer 24 is completely covered by the metal barrier layers 23, which can eliminate the cross-talk problem (such as coupling signals, etc.) and high frequency effect between adjacent circuits, and also inhibit migration of copper particles to the insulating layer between adjacent circuits or between adjacent circuit layers. As a result, the insulating layer of the substrate can be made thinner to form a thinner multi-layer circuit board.

Moreover, a solder mask layer 25 patterned to have a plurality of openings can be formed on the substrate, allowing the electrical connection pads 240 of the patterned circuit layer 24 to be exposed via the openings. A metal protection layer 26 (such as Ni/Au layer) can be formed in the openings of the solder mask layer 25 and on the electrical connection pads 240; or the metal protection layer 26 can be directly electroplated on the electrical connection pads 240 and completely covers the electrical connection pads 240 so as to provide good electrical connection and protection functions for the electrical connection pads 240.

The above electrical connection pads can be wire-bonded pads, bump pads, pre-solder bump pads or ball pads. The patterned circuit structure and the number of electrical connection pads are simplified for illustration in the drawings. The fabrication processes of the circuit barrier structure can also be implemented on one single side or double sides of the substrate and for the inner circuits or surface circuits of the substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a circuit barrier structure of a semiconductor packaging substrate, comprising the steps of:
    preparing the substrate having inner circuits and an insulating layer, forming a metal conductive layer on a surface of the substrate, and forming a patterned first resist layer on the metal conductive layer, wherein the patterned first resist layer has a plurality of holes to expose predetermined parts of the metal conductive layer;
    forming a metal barrier layer on the patterned first resist layer and in the holes of the first resist layer to cover the exposed parts of the metal conductive layer;
    removing the metal barrier layer on the patterned first resist layer;
    performing an electroplating process to form a patterned circuit layer and an electrical connection pad in the holes of the first resist layer and on the retained metal barrier layer;
    forming a second resist layer on the surface of the substrate to cover the patterned circuit layer, allowing the electrical connection pad of the circuit layer to be exposed from the second resist layer; and
    performing another electroplating process to form a metal protection layer on the exposed electrical connection pad.

2. The method of claim 1, further comprising performing a further electroplating process to form another metal barrier layer on the patterned circuit layer before forming the second resist layer on the surface of the substrate.

3. The method of claim 1, further comprising:
    removing the second resist layer, the first resist layer and the metal conductive layer covered by the first resist layer; and
    forming a solder mask layer on the surface of the substrate, the solder mask layer being patterned to have an opening to expose the metal protection layer.

4. The method of claim 1, wherein the metal protection layer is made of a material selected from the group consisting of Au, Ni, Pd, Ag, Sn, Ni/Pd, Cr/Ti, Ni/Au, Pd/Au, and Ni/Pd/Au.

5. The method of claim 1, wherein the metal barrier layer is made of a material selected from the group consisting of Cr, Ni, Co, Pd, Tantalum (Ta), and Ti.

* * * * *